US 8,866,298 B2

(12) United States Patent
Bayerer (10) Patent No.: US 8,866,298 B2
(45) Date of Patent: Oct. 21, 2014

(54) BONDED SYSTEM WITH COATED COPPER CONDUCTOR (71) Applicant: Infineon Technologies AG, Neubiberg (DE)

(72) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/739,351

(22) Filed: Jan. 11, 2013

(65) Prior Publication Data
US 2014/0197539 A1 Jul. 17, 2014

(51) Int. Cl.
H01L 23/48 (2006.01)
H01L 21/44 (2006.01)
H01L 23/00 (2006.01)

(52) U.S. Cl.
CPC .............. H01L 24/05 (2013.01); H01L 24/03 (2013.01)
USPC ........... 257/762; 257/765; 257/771; 257/773; 257/781; 257/E23.158; 257/E23.161; 438/612; 438/614; 438/687; 438/688

(58) Field of Classification Search
USPC .................. 257/737, 738, 771, 773, E23.021, 257/E23.069, 762, 765, 780–782, 784, 257/E23.158, E23.159, E23.16, E23.161; 438/612, 614, 687, 688
See application file for complete search history.

(56) References Cited

U.S. PATENT DOCUMENTS

| | | | | |
|---|---|---|---|---|
| 4,078,980 A | * | 3/1978 | Harris et al. | 205/717 |
| 5,455,195 A | * | 10/1995 | Ramsey et al. | 438/612 |
| 2008/0093729 A1 | | 4/2008 | Siepe et al. | |
| 2013/0277825 A1 | * | 10/2013 | Zhang et al. | 257/734 |

OTHER PUBLICATIONS

Ralf Schmidt et al. "Al-Clad CU Wire Bonds Multiply Power Cycling Lifetime of Advanced Power Modules." PCIM Europe 2012, May 8-10, 2012, Nuremburg. Paper 104, pp. 776-783.

* cited by examiner

Primary Examiner — Jasmine Clark
(74) Attorney, Agent, or Firm — Murphy, Bilak & Homiller, PLLC (57) ABSTRACT A semiconductor component includes a semiconductor die and a copper-containing electrical conductor. The semiconductor die has a semiconductor device region, an aluminum-containing metal layer on the semiconductor device region, and at least one additional metal layer on the aluminum-containing metal layer which is harder than the aluminum-containing metal layer. The copper-containing electrical conductor is bonded to the at least one additional metal layer of the semiconductor die via an electrically conductive coating of the copper-containing electrical conductor which is softer than the copper of the copper-containing electrical conductor.

22 Claims, 7 Drawing Sheets

BONDED SYSTEM WITH COATED COPPER CONDUCTOR

TECHNICAL FIELD

The present application relates to interconnect systems for semiconductor components, in particular copper-based interconnect systems for semiconductor components with standard aluminium metallization.

BACKGROUND

Interconnect systems, which are generated by an ultrasonic bonding process, for surfaces of active power semiconductor dies typically include a heavy aluminium wire bonded to aluminium metallization disposed on the die surface, or a heavy copper wire bonded to copper metallization disposed on the die surface. Attempts have been made to bond aluminium-coated copper wires to power semiconductor dies which have standard aluminium metallization. However, due to the hard copper core of such wires they sink into the aluminium metallization of the die during the ultrasonic bonding process and damage the active device area below the aluminium metallization.

SUMMARY

The embodiments described herein provide a copper-based interconnect system for semiconductor components with standard aluminium metallization. The semiconductor components have at least one additional metal layer on the standard aluminum metallization layer which protects against extreme deformation of the underlying standard aluminum metallization during ultrasonic bonding of a coated copper-containing electrical conductor.

According to an embodiment of a semiconductor component, the component comprises a semiconductor die having a semiconductor device region, an aluminum-containing metal layer on the semiconductor device region, and at least one additional metal layer on the aluminum-containing metal layer which is harder than the aluminum-containing metal layer. The semiconductor component further comprises a copper-containing electrical conductor bonded to the at least one additional metal layer of the semiconductor die via an electrically conductive coating of the copper-containing electrical conductor which is softer than the copper of the copper-containing electrical conductor.

According to an embodiment of a method of manufacturing a semiconductor component, the method comprises: providing a semiconductor die having a semiconductor device region, an aluminum-containing metal layer on the semiconductor device region, and at least one additional metal layer on the aluminum-containing metal layer which is harder than the aluminum-containing metal layer; and ultrasonically bonding a copper-containing electrical conductor to the at least one additional metal layer of the semiconductor die via an electrically conductive coating of the copper-containing electrical conductor which is softer than the copper of the copper-containing electrical conductor.

According to yet another embodiment of a semiconductor component, the component comprises a semiconductor die having a semiconductor device region, an aluminum-containing metal layer on the semiconductor device region, and at least one additional metal layer on the aluminum-containing metal layer. The semiconductor component further comprises a copper-containing electrical conductor bonded to the at least one additional metal layer of the semiconductor die via an electrically conductive coating of the copper-containing electrical conductor which is softer than the copper of the copper-containing electrical conductor. The at least one additional metal layer of the semiconductor die is hard enough to prevent significant deformation of the aluminum-containing metal layer of the semiconductor die when the copper-containing electrical conductor is bonded to the at least one additional metal layer of the semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
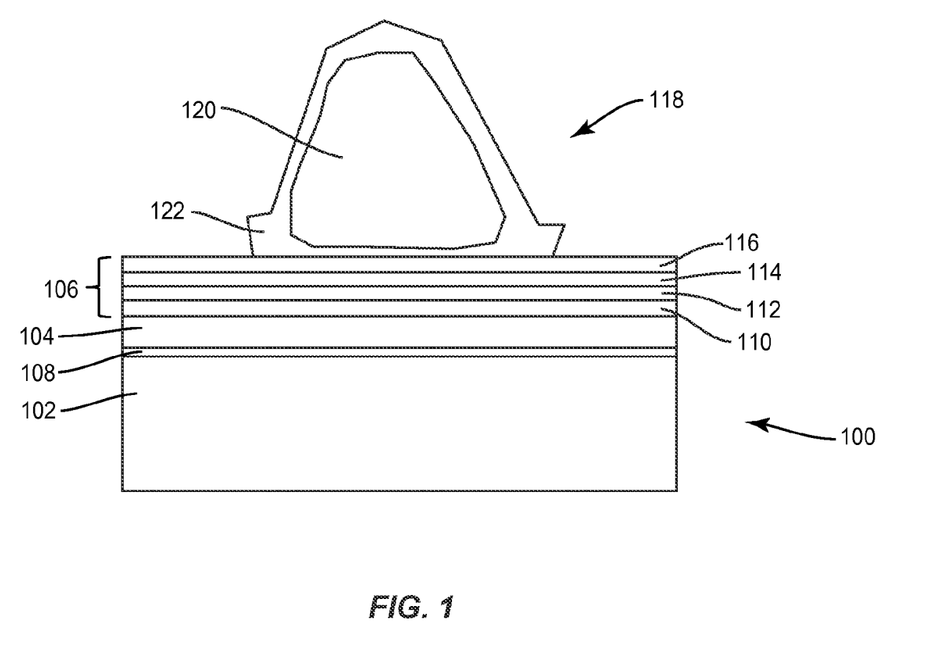
FIG. 1 illustrates a front cross-sectional view of an embodiment of a semiconductor component with standard aluminium metallization ultrasonically bonded to a coated copper-containing electrical conductor.

FIG. 1 illustrates a front cross-sectional view of an embodiment of a semiconductor component. The semiconductor component includes a semiconductor die 100 having a semiconductor device region 102, a standard aluminum-containing metal layer 104 such as Al, AlSi, AlSiCu, etc. on the semiconductor device region 102, and at least one additional metal layer 106 on the aluminum-containing metal layer 104. The semiconductor device region 102 is a region of the die 100 in which active and/or passive devices such as transistors, diodes, resistors, capacitors, etc. can be formed. The semiconductor device region 102 includes the semiconductor material in which the devices are formed, and can include a monocrystalline semiconductor such as Si or Ge, binary compounds such as GaN, GaAs, SiC, ternary compounds, etc. One or more insulating layers such as oxides and/or nitrides can be disposed on the semiconductor material as part of the semiconductor device region 102. An optional barrier metal 108 such as TiN, TiW, W, Ti, etc. can be disposed between the semiconductor device region 102 and the aluminum-containing metal layer 104. In either case, the at least one additional metal layer 106 on the aluminum-containing metal layer 104 is harder than the aluminum-containing metal layer 104 to prevent damage during the subsequent copper interconnect ultrasonic bonding process.

According to the embodiment illustrated in FIG. 1, four additional metal layers 110, 112, 114, 116 are formed on the aluminum-containing metal layer 104 of the semiconductor die 100, to protect the aluminum-containing metal layer 104 during the subsequent ultrasonic bonding process. The lowermost layer 110 contains copper and is formed on the aluminum-containing metal layer 104. The next layer 112 contains nickel, e.g. Ni, NiP, NiMoP, and is formed on the copper-containing metal layer 110. The next layer 114 contains palladium and is formed on the nickel-containing metal layer 112. The last layer 116 contains gold and is formed on the palladium-containing metal layer 114. The additional layers 110, 112, 114, 116 can be formed on the aluminum-containing metal layer 104 of the semiconductor die 100 by sputtering, plating, or other suitable conventional process.

The semiconductor component further includes a copper-containing electrical conductor 118 which includes a copper-containing core 120 and an electrically conductive coating 122 on the core 120. The copper-containing electrical conductor 118 is ultrasonically bonded to the at least one additional metal layer 106 of the semiconductor die 100 via the coating 122 on the core 120 of the copper-containing electrical conductor 118. In some embodiments, the coating 122 comprises Al, Al alloy, Pd, Pd alloy, Ni, or Ni alloy. In one specific embodiment, the coating 122 comprises homogenous AlMg with a small amount of Mg e.g. AlMg0.1. In general, the coating 122 is softer than the copper of the copper-containing electrical conductor 118 so that the copper-containing electrical conductor 118 is ultrasonically bonded to the additional metal layer(s) 106 of the semiconductor die 100 via the coating 122.

The additional metal layer(s) 106 of the semiconductor die 100 are hard enough to prevent significant deformation of the underlying aluminum-containing metal layer 104 when the copper-containing electrical conductor 118 is ultrasonically bonded to the at least one additional metal layer 106 of the semiconductor die 100, by spreading the force from the copper-containing electrical conductor 118 over a larger area of the aluminum-containing metal layer 104. The term 'significant' as used herein means that some deformation of the underlying aluminum-containing metal layer 104 is acceptable and supports the ultrasonic bonding process. However, the aluminum-containing metal layer 104 is displaced by less than a predetermined amount under the copper-containing electrical conductor 118 to ensure integrity and reliability of the structure. As shown in FIG. 1 where the core 120 of the copper-containing electrical conductor 118 is a bond wire, the additional metal layer(s) 106 of the semiconductor die 100 can be so hard that the bond wire core 120 is deformed when bonded to the at least one additional metal layer 106 of the semiconductor die 100 without significantly damaging the underlying aluminum-containing metal layer 104.

Figure 2:
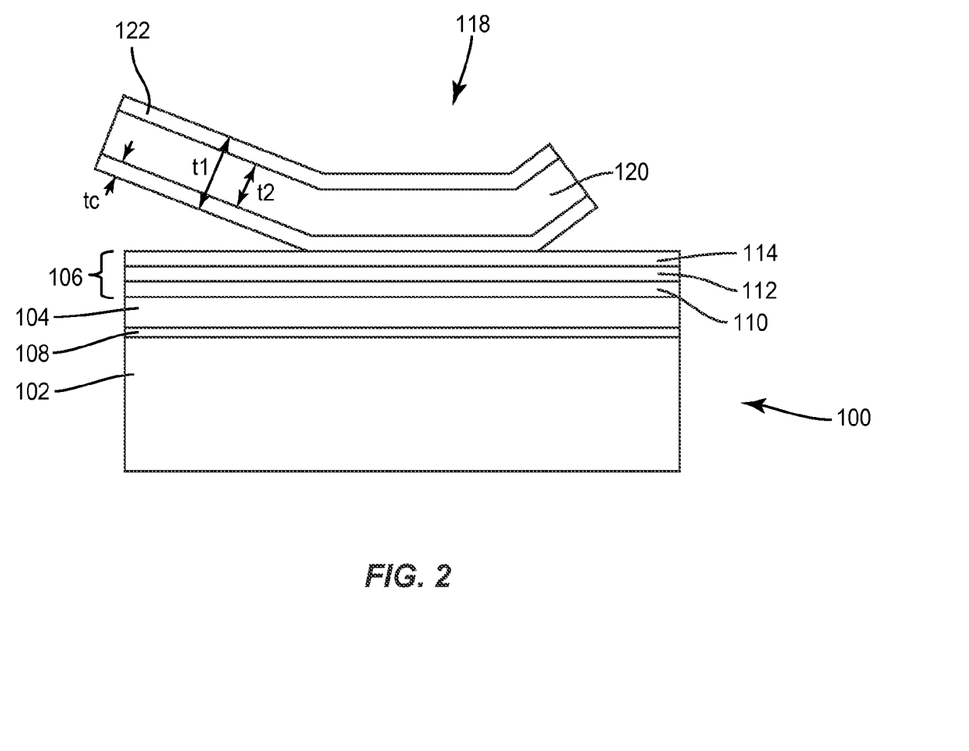
FIG. 2 illustrates a side cross-sectional view of an embodiment of a semiconductor component with standard aluminium metallization ultrasonically bonded to a coated copper-containing electrical conductor.

FIG. 2 illustrates a side cross-sectional view of another embodiment of the semiconductor component. The embodiment shown in FIG. 2 is similar to the one shown in FIG. 1, however, the at least one additional metal layer 106 of the semiconductor die 100 includes three metal layers 110, 112, 114 formed on the aluminum-containing metal layer 104 instead of four layers. According to this embodiment, the lowermost layer 110 contains copper and is formed on the aluminum-containing metal layer 104. The next layer 112 contains nickel, e.g. Ni, NiP, NiMoP, and is formed on the copper-containing metal layer 110. The last layer 114 contains palladium and is formed on the nickel-containing metal layer 112. The additional layers 106 can be formed on the aluminum-containing metal layer 104 of the semiconductor die by sputtering, plating, or other suitable conventional process, and protect the underlying aluminum-containing metal layer 104 from significant deformation during ultrasonic bonding of the copper-containing electrical conductor 118.

Further according to this embodiment, the electrically conductive coating 122 is applied to all sides of the copper-containing electrical conductor core 120 as shown in FIG. 2. In one case, the copper-containing electrical conductor 118 has a thickness (t1) of at least 200 μm including the coating 122. The core 120 of the copper-containing electrical conductor 118 can have a thickness (t2) of at least 100 μm. In one embodiment, the coating 122 of the copper-containing electrical conductor 118 comprises Al and has a thickness (tc) of at least 50 μm. In another embodiment, the coating 122 comprises an Al alloy and has a thickness (tc) of at least 30 μm. In each case, the coating 122 provides for ultrasonic bonding of the copper-containing electrical conductor 118 to the uppermost additional metal layer 114 of the semiconductor die 100.

Figure 3:
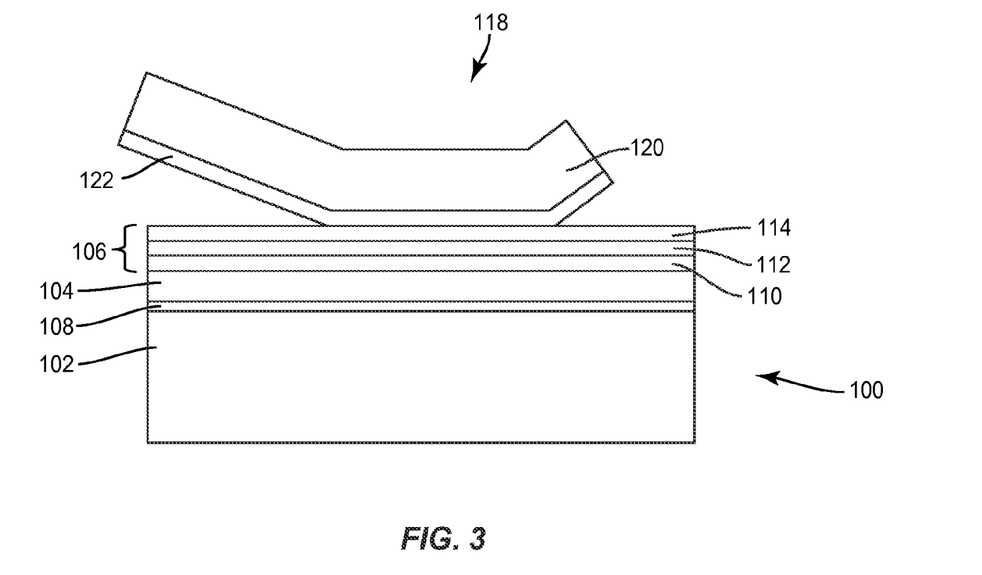
FIG. 3 illustrates a side cross-sectional view of another embodiment of a semiconductor component with standard aluminium metallization ultrasonically bonded to a coated copper-containing electrical conductor.

FIG. 3 illustrates a side cross-sectional view of yet another embodiment of the semiconductor component. According to this embodiment, the copper-containing electrical conductor 118 is a ribbon and the electrically conductive coating 122 is applied only to the side of the copper-containing ribbon 118 facing the semiconductor die 100.

Figure 4:
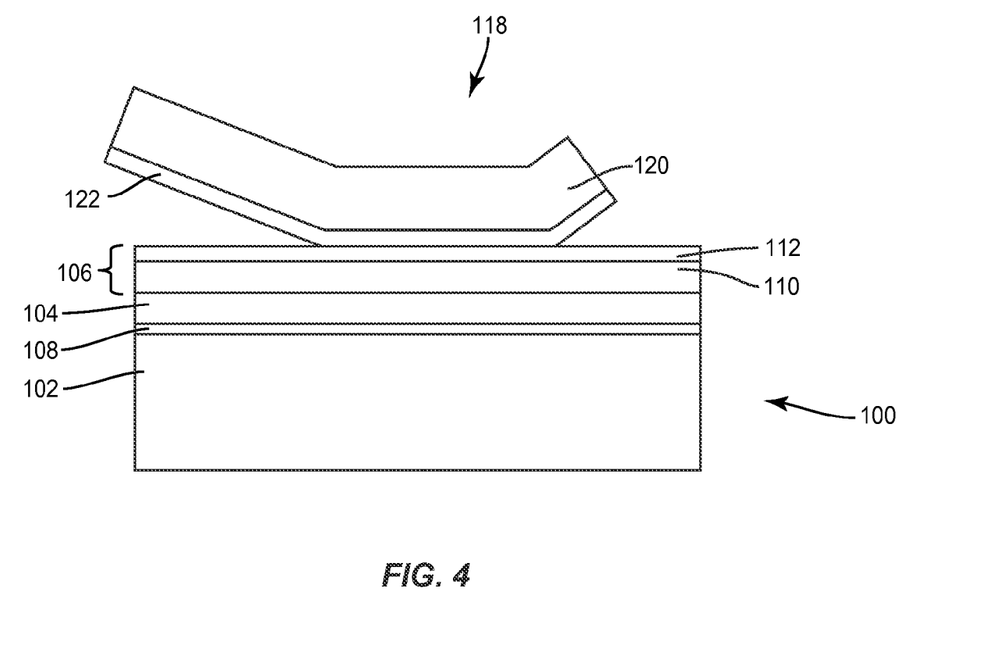
FIG. 4 illustrates a side cross-sectional view of yet another embodiment of a semiconductor component with standard aluminium metallization ultrasonically bonded to a coated copper-containing electrical conductor.

FIG. 4 illustrates a side cross-sectional view of still another embodiment of the semiconductor component. The embodiment shown in FIG. 4 is similar to the one shown in FIG. 3, however, the at least one additional metal layer 106 of the semiconductor die 100 includes two metal layers 110, 112 formed on the aluminum-containing metal layer 104 instead of three layers. In one case, the bottom layer 110 contains copper and is formed on the aluminum-containing metal layer 104. The top layer 112 contains nickel, e.g. Ni, NiP, NiMoP, and is formed on the copper-containing metal layer 110. In another case, the bottom layer 110 contains nickel, e.g. Ni, NiP, NiMoP, and is formed on the aluminum-containing metal layer 104. The top layer 112 contains palladium and is formed on the copper-containing metal layer 110. In each case, the additional layers 110, 112 can be formed by sputtering, plating, or other suitable conventional process, and protect the underlying aluminum-containing metal layer 104 from significant deformation during ultrasonic bonding of the copper-containing electrical conductor 118.

Figure 5:
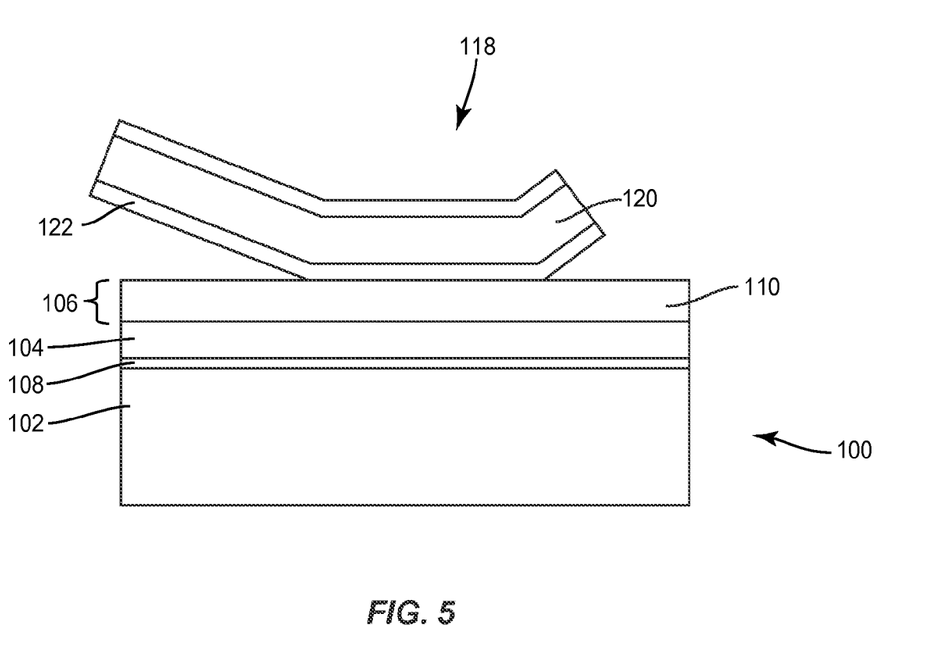
FIG. 5 illustrates a side cross-sectional view of still another embodiment of a semiconductor component with standard aluminium metallization ultrasonically bonded to a coated copper-containing electrical conductor.

FIG. 5 illustrates a side cross-sectional view of another embodiment of the semiconductor component. The embodiment shown in FIG. 5 is similar to the one shown in FIG. 2, however, the at least one additional metal layer 106 of the semiconductor die 100 includes a single metal layer 110 formed on the aluminum-containing metal layer 104 instead of three layers. The single additional layer 110 contains copper or nickel (e.g. Ni, NiP, NiMoP) and is formed on the aluminum-containing metal layer 104. The single additional layer 110 can be formed by sputtering, plating, or other suitable conventional process, and protects the underlying aluminum-containing metal layer 104 from significant deformation during ultrasonic bonding of the copper-containing electrical conductor 118.

Figure 6:
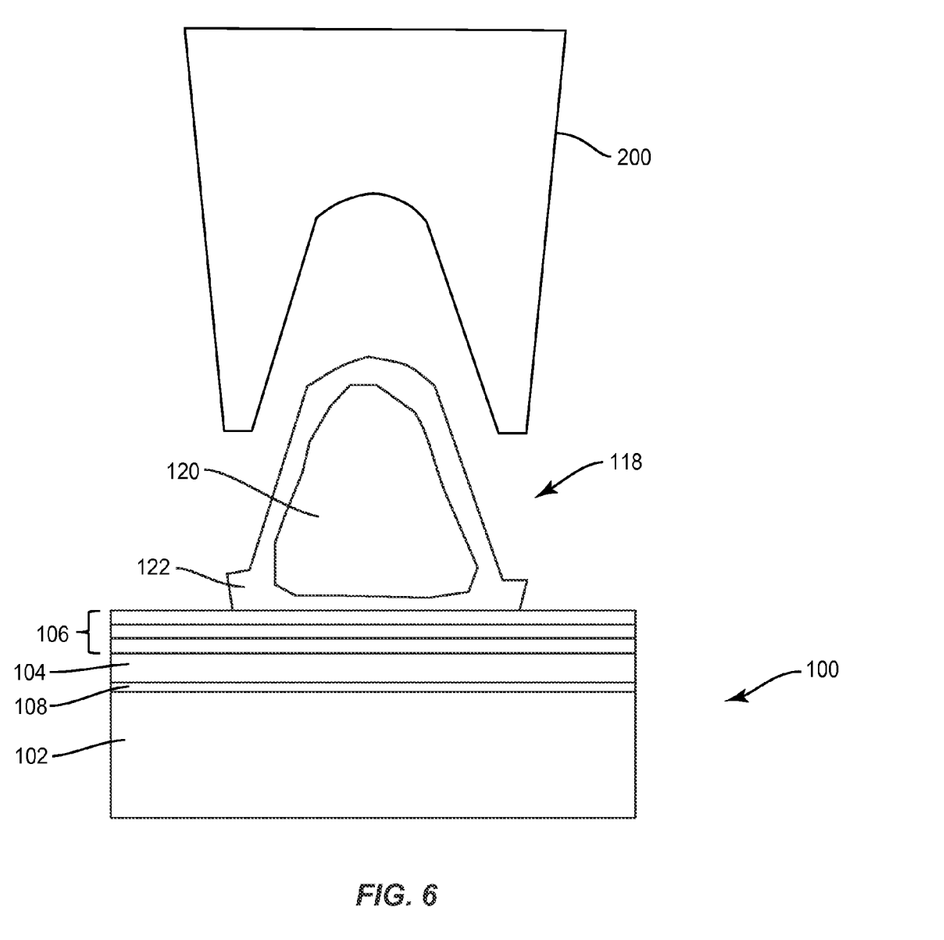
FIG. 6 illustrates an embodiment of a bonding tool for ultrasonically bonding a coated copper-containing electrical conductor to standard aluminium metallization of a semiconductor component.

FIG. 6 illustrates an embodiment of a V-shaped ultrasonic bonding tool 200 for ultrasonically bonding the copper-containing electrical conductor 118 to the at least one additional metal layer 106 formed on the aluminum-containing metal layer 104 of the semiconductor die 100. The semiconductor die 100 is provided with the semiconductor device region 102, the aluminum-containing metal layer 104 on the semiconductor device region 102, and the at least one additional metal layer 106 on the aluminum-containing metal layer 104 which is harder than the aluminum-containing metal layer 104. The V-shaped bonding tool 200 bonds the copper-containing electrical conductor 118 to the at least one additional metal layer 106 of the semiconductor die 100 via the electrically conductive coating 122 of the copper-containing electrical conductor 118. The softer coating 122 of the copper-containing electrical conductor 118 bonds to the at least one additional metal layer 106 formed on the aluminum-containing metal layer 104 of the semiconductor die 100 e.g. optionally under elevated temperature and always under pressure and with ultrasonic vibrations. The copper-containing electrical conductor 118 is pressed against the uppermost layer of the at least one additional metal layer 106 by the V-shaped bonding tool 200. The resulting V-shape of the copper-containing electrical conductor 118 at the bonding region is a consequence of pressure and ultrasonic vibration applied through the V-shaped bonding tool 200. During the ultrasonic bonding process, the copper-containing electrical conductor 118 becomes deformed this way.

Figure 7:
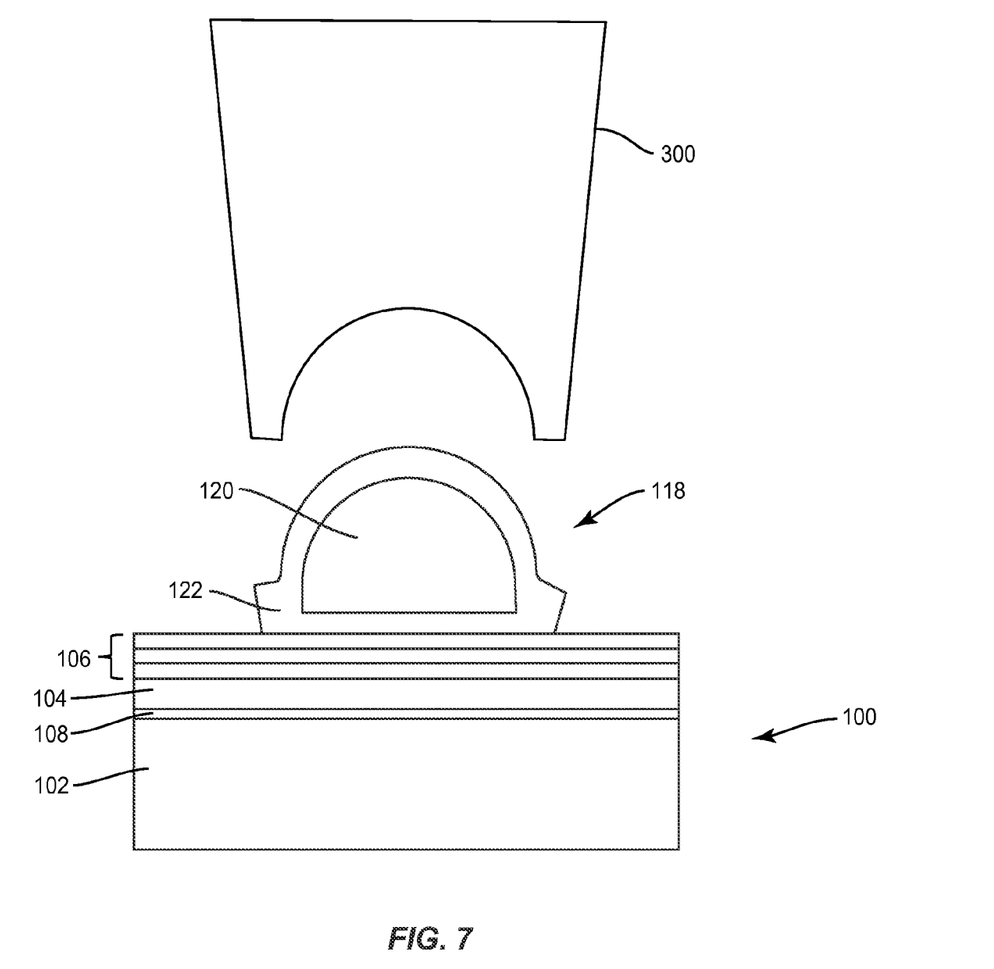
FIG. 7 illustrates another embodiment of a bonding tool for ultrasonically bonding a coated copper-containing electrical conductor to standard aluminium metallization of a semiconductor component.

FIG. 7 illustrates an embodiment of a U-shaped ultrasonic bonding tool 300 for bonding the copper-containing electrical conductor 118 to the at least one additional metal layer 106 formed on the aluminum-containing metal layer 104 of the semiconductor die 100. The embodiment shown in FIG. 7 is similar to the one shown in FIG. 6, however the copper-containing electrical conductor 118 is pressed against the uppermost layer of the at least one additional metal layer 106 with the U-shaped bonding tool 300 instead of a V-shaped bonding tool, yielding a U-shaped cross-section bond instead of a V-shaped cross-section bond.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    a semiconductor die having a semiconductor device region, an aluminum-containing metal layer on the semiconductor device region, and at least one additional metal layer on the aluminum-containing metal layer which is harder than the aluminum-containing metal layer; and
    a copper-containing electrical conductor bonded to the at least one additional metal layer of the semiconductor die via an electrically conductive coating of the copper-containing electrical conductor which is softer than the copper of the copper-containing electrical conductor.

2. The semiconductor component according to claim 1, wherein the coating of the copper-containing electrical conductor comprises a material selected from the group consisting of Al, Al alloy, Pd, Pd alloy, Ni, and Ni alloy.

3. The semiconductor component according to claim 2, wherein the coating of the copper-containing electrical conductor comprises AlMg.

4. The semiconductor component according to claim 1, wherein the at least one additional metal layer of the semiconductor die comprises:
    a copper-containing metal layer on the aluminum-containing metal layer; and
    a nickel-containing metal layer on the copper-containing metal layer.

5. The semiconductor component according to claim 4, wherein the at least one additional metal layer of the semiconductor die further comprises a palladium-containing metal layer on the nickel-containing metal layer.

6. The semiconductor component according to claim 5, wherein the at least one additional metal layer of the semiconductor die further comprises a gold-containing metal layer on the palladium-containing metal layer.

7. The semiconductor component according to claim 1, wherein the at least one additional metal layer of the semiconductor die comprises:
    a nickel-containing metal layer on the aluminum-containing metal layer; and
    a palladium-containing metal layer on the nickel-containing metal layer.

8. The semiconductor component according to claim 1, wherein the at least one additional metal layer of the semiconductor die comprises a copper or nickel-containing metal layer on the aluminum-containing metal layer.

9. The semiconductor component according to claim 1, wherein the copper-containing electrical conductor has a thickness of at least 200 μm including the coating.

10. The semiconductor component according to claim 1, wherein the coating comprises Al and has a thickness of at least 50 μm.

11. The semiconductor component according to claim 1, wherein the coating comprises an Al alloy and has a thickness of at least 30 μm.

12. The semiconductor component according to claim 1, wherein the copper-containing electrical conductor has a U-shaped cross-section where bonded to the at least one additional metal layer of the semiconductor die.

13. The semiconductor component according to claim 1, wherein the coating is applied only to a side of the copper-containing electrical conductor facing the semiconductor die.

14. A method of manufacturing a semiconductor component, the method comprising:
    providing a semiconductor die having a semiconductor device region, an aluminum-containing metal layer on the semiconductor device region, and at least one additional metal layer on the aluminum-containing metal layer which is harder than the aluminum-containing metal layer; and
    ultrasonically bonding a copper-containing electrical conductor to the at least one additional metal layer of the semiconductor die via an electrically conductive coating of the copper-containing electrical conductor which is softer than the copper of the copper-containing electrical conductor.

15. The method according to claim 14, further comprising forming the at least one additional metal layer on the aluminum-containing metal layer by sputtering or plating:
   a copper-containing metal layer on the aluminum-containing metal layer; and
   a nickel-containing metal layer on the copper-containing metal layer.

16. The method according to claim 15, further comprising forming the at least one additional metal layer on the aluminum-containing metal layer by sputtering or plating a palladium-containing metal layer on the nickel-containing metal layer.

17. The method according to claim 16, further comprising forming the at least one additional metal layer on the aluminum-containing metal layer by sputtering or plating a gold-containing metal layer on the palladium-containing metal layer.

18. The method according to claim 14, further comprising forming the at least one additional metal layer on the aluminum-containing metal layer by sputtering or plating:
   a nickel-containing metal layer on the aluminum-containing metal layer; and
   a palladium-containing metal layer on the nickel-containing metal layer.

19. The method according to claim 14, further comprising forming the at least one additional metal layer on the aluminum-containing metal layer by sputtering or plating a copper or nickel-containing metal layer on the aluminum-containing metal layer.

20. The method according to claim 14, further comprising pressing the copper-containing electrical conductor against the at least one additional metal layer of the semiconductor die using a U-shaped bonding tool so that the copper-containing electrical conductor has a U-shaped cross-section where bonded to the at least one additional metal layer of the semiconductor die.

21. A semiconductor component, comprising:
   a semiconductor die having a semiconductor device region, an aluminum-containing metal layer on the semiconductor device region, and at least one additional metal layer on the aluminum-containing metal layer;
   a copper-containing electrical conductor bonded to the at least one additional metal layer of the semiconductor die via an electrically conductive coating of the copper-containing electrical conductor which is softer than the copper of the copper-containing electrical conductor; and
   wherein the at least one additional metal layer of the semiconductor die is hard enough to prevent significant deformation of the aluminum-containing metal layer of the semiconductor die when the copper-containing electrical conductor is bonded to the at least one additional metal layer of the semiconductor die.

22. The semiconductor component according to claim 21, wherein the at least one additional metal layer of the semiconductor die is also hard enough so that the copper-containing electrical conductor is deformed when bonded to the at least one additional metal layer of the semiconductor die.

* * * * *